United States Patent [19]

Ericsson

[11] Patent Number: 4,715,278
[45] Date of Patent: Dec. 29, 1987

[54] SQUEEGEE ARRANGEMENT FOR SILKSCREEN PRINTERS

[75] Inventor: Sylve J. D. Ericsson, Tumba, Sweden
[73] Assignee: Svecia Silkscreen Maskiner AB, Norsborg, Sweden
[21] Appl. No.: 879,604
[22] Filed: Jun. 27, 1986
[51] Int. Cl.$^4$ ............................................. B05C 17/04
[52] U.S. Cl. ............................................... 101/123
[58] Field of Search ............... 101/114, 115, 123, 126, 101/127, 128; 118/213

[56] References Cited

U.S. PATENT DOCUMENTS

| | | | |
|---|---|---|---|
| 2,783,709 | 3/1957 | Thomas | 101/123 |
| 2,814,987 | 12/1957 | Foard | 101/123 |
| 2,863,382 | 12/1958 | Giani | 101/123 |
| 3,483,819 | 12/1969 | Hughes, Jr. | 101/123 |
| 4,193,344 | 3/1980 | Ericsson | 101/123 |
| 4,267,773 | 5/1981 | Scherp et al. | 101/123 |

FOREIGN PATENT DOCUMENTS

| | | | |
|---|---|---|---|
| 1178062 | 5/1959 | France | 101/123 |
| 1383023 | 11/1964 | France | 101/123 |
| 789175 | 1/1958 | United Kingdom | 101/123 |
| 525565 | 1/1969 | U.S.S.R. | 101/123 |
| 590158 | 1/1978 | U.S.S.R. | 101/123 |

Primary Examiner—E. H. Eickholt
Attorney, Agent, or Firm—Burns, Doane, Swecker & Mathis

[57] ABSTRACT

The present invention relates to a squeegee arrangement for silkscreen printing machines, comprising two squeegees arranged side-by-side and made from a somewhat flexible material, and respective squeegee holders. The squeegees (5,5a) are arranged to move relative to a stencil (3) having a printing pattern provided thereon and located above a material substrate (4) to be printed upon. The squeegees are arranged to press print-forming substance (10) through the stencil (3) and onto the material substrate (4) during this relative movement. A plane extending centrally through respective squeegees forms an obtuse angle with the stencil and the material substrate in relation to the directional plane of squeegee movement. The centrally located planes of the two mutually adjacent squeegees (5,5a) subtend therebetween an angle of less than 120°, and greater than 60°, and one of said squeegees (5) is arranged to co-act with the stencil (4) to effect printing in a first direction of squeegee movement, and the other squeegee (5a) is arranged to co-act with the stencil to effect printing in a second direction of squeegee movement opposite to said first direction.

8 Claims, 3 Drawing Figures

SQUEEGEE ARRANGEMENT FOR SILKSCREEN PRINTERS

TECHNICAL FIELD

The present invention relates primarily to a squeegee arrangement for a silkscreen printer, and particularly, although not exclusively, to a squeegee arrangement which comprises at least two squeegees located in mutually adjacent relationship and made of a somewhat resilient material, and a respective squeegee holder.

Each of the squeegees is arranged to move relative to a stencil having a print pattern provided thereon and being placed above a material substrate to be printed upon. Each squeegee is arranged to press print-forming substance through the stencil and onto the underlying substrate material during said relative movement. In addition each squeegee has a centrally extending plane which forms an obtuse angle with the stencil and the substrate material in relation to the movement plane of the squeegee during a printing sequence.

BACKGROUND PRIOR ART

The prior state of the art includes a manually movable squeegee which can be displaced in solely one direction while co-acting with the stencil to effect a printing sequence. When the squeegee, together with a print-forming substance, is located in a terminal position, a scoop is placed under the print-forming substance, the scoop and the squeegee forming a holder for bringing the substance and the squeegee to the start position and for placing said substance in front of the squeegee, wherewith the squeegee can again be displaced to the terminal position.

It is known in this manual procedure to rotate the squeegee so that a plane passing centrally therethrough forms an obtuse angle with the stencil and substrate material upon displacement of the squeegee along the stencil.

Squeegee arrangements of this kind intended for silkscreen printers are known to the art, and are intended for use when printing on material substrates whose print surfaces are not totally smooth and flat, but exhibit small promontories, for example irregularities of the kind found on printed circuit boards or cards, so as to ensure that a print-forming substance, e.g. a substance which inhibits the adhesive properties of molten solder, can also be applied effectively to the spaces located between minor promontories on the material substrate.

Various measures have also been proposed in connection with the stencil, for enabling adjustments to be made to the quantity of ink which passes through the stencil and onto the material substrate. In this regard experiments have also been carried out with different types of ink, and the viscosity of the ink, etc.

SUMMARY OF THE INVENTION

Technical Problems

It will be realized from the above account of the present state of the art that one technical problem resides in providing measures which will enable the number of prints made per unit of time to be increased inspite of the difficulties associated with the irregularities on the surface of the substrate material.

With regard to those circumstances which prevail when applying print to printed circuit boards having an irregular print surface, it will be understood that a still greater problem is one of providing measures with which the print can also be distributed effectively between upstanding promontories, while still enabling a greater number of prints to be made per unit of time.

In conjunction with such measures, a further qualified technical problem is one of enabling print to be applied to a material substrate both in a first direction of squeegee movement relative to the stencil and in a second direction of movement of a further squeegee adjacent the former squeegee, this second direction being opposite to the first.

A further qualified technical problem is one of enabling two squeegees to be arranged closely adjacent one another and to enable each squeegee to be raised and lowered to a printing position and to a position in which the print-forming substance is replenished and distributed over the stencil.

It will also be seen that another technical problem is one of providing conditions with the aid of simple means which enable the passage of print-forming substance through the stencil to be regulated without needing to alter the stencil to this end.

A further technical problem is one of adjusting the amount of print-forming substance that passes through the stencil during a printing sequence with the aid of simple means, so that said amount is equal to or only slightly exceeds the smallest amount required by the stencil, the form of the print applied, and the material substrate to be printed upon, in order to carry out the printing sequence satisfactorily.

Another technical problem is one of providing simple means which, in the case of printing sequences effected in two mutually opposite directions, will make compensations for discrepancies in the stencil printing pattern due to stretching of the stencil, inter alia as a result of the frictional forces created by the squeegee during its movement over the stencil, so that printing can be effected satisfactorily in both directions.

Solution

The present invention relates to a squeegee arrangement intended for use in silkscreen printers and comprising at least two squeegees made of a somewhat flexible material, and a respective squeegee holder, in which arrangement each squeegee is arranged for movement relative to the stencil provided with a print pattern and located above a material substrate to be printed upon, and in which each stencil is arranged to press a print-forming substance through the stencil and onto the substrate, and each squeegee has extending centrally therethrough a plane which forms an obtuse angle with the stencil and the substrate in relation to the direction of squeegee movement.

It is proposed in accordance with the invention that the respective centrally located planes of respectige mutually adjacent squeegees form together an angle smaller than 120°, and that one squeegee is arranged to co-act with the stencil to produce print in a first direction of movement, and that the other squeegee is arranged to co-act with the stencil to produce print in an opposite direction of movement.

An advantage is afforded when the squeegee arrangement is such that one squeegee of said pair of mutually adjacent squeegees serves as a means for distributing print-forming substance over the print face of the stencil when the other of said stencils co-acts with the stencil to produce print in a respectige one of said directions.

In accordance with one embodiment of the invention the part of a respective squeegee which faces and abuts the stencil presents an edge which is formed by two surfaces which form a right angle with one another.

The centrally oriented planes of the two squeegees preferably form therebetween an angle which is greater than 60°. A particular advantage is afforded when this angle lies within the range of 100° and 80°, and a still greater advantage is obtained when this angle can be changed during a printing sequence, since a change in the size of said angle results in a change in the amount of print-forming substance passing through the stencil.

Since when using a squeegee in accordance with the invention it is possible to print in two mutually opposite directions with one and the same stencil, there is provided in accordance with one embodiment means for compensating for discrepancies in the stencil print pattern on the substrate material caused by stretching of the stencil due to the frictional forces between stencil and squeegee. These means are operative to move the stencil in a direction opposite to that moved by the printing squeegee and/or to move the printing platen in the direction of squeegee movement.

Advantages

Those advantages primarily characteristic of a squeegee arrangement according to the present invention reside in enabling printing to be effected in two mutually opposite directions of squeegee travel, while ensuring at the same time that the print-forming substance can also be pressed through the stencil into areas of the upper surface of the substrate to be printed upon located between upstanding parts or areas of said surface. Discrepancies in pattern transfer due to stretching of the stencil can also be readily achieved.

The primary characteristic features of a silkscreen printing machine and its squeegee arrangement according to the invention are set forth in the characterizing clause of claim 1.

BRIEF DESCRIPTION OF THE DRAWING

A squeegee arrangement for silkscreen printers and a discrepancy compensating device in accordance with the invention will now be described in more detail with reference to the accompanying drawing, in which.

DESCRIPTION OF A PREFERRED EMBODIMENT

Figure 1:
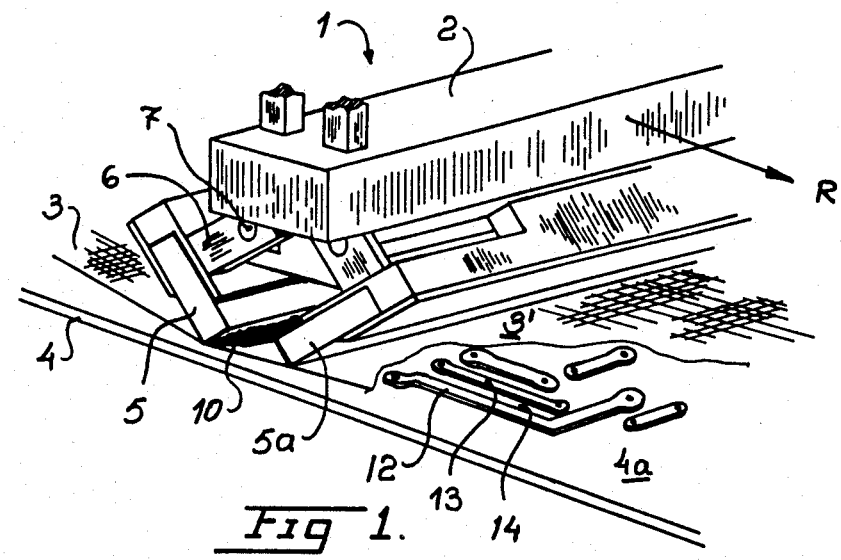
FIG. 1 is a perspective view of a squeegee arrangement comprising two inclined squeegees, said squeegees being shown in a position in which the one squeegee co-acts with a stencil to effect a printing sequence.

FIG. 1 illustrates in perspective and in a highly simplified manner a squeegee arrangement according to the invention intended for a silkscreen printer. The squeegee arrangement 1 is carried by a beam 2 which is attached to the printer in known manner and arranged for movement relative to a stencil 3 placed in the printer above material 4 to be printed upon.

Although the following description is made with reference to an embodiment in which the squeegee arrangement 1 is moved relative to the stencil 3 and the material 4, it will be understood that the invention can also be applied in silkscreen printers in which the squeegee arrangement is stationary in relation to the frame and in which the stencil 3, the material 4, and a printing platen supporting said material are arranged for movement relative to the squeegee arrangement.

The squeegee arrangement 2 includes a first squeegee 5 made of a somewhat flexible material, and a squeegee holder 6 rotatably connected to the beam 2 via an axle 7.

The squeegee 5 is arranged to execute a movement "R" relative to a stencil 3, which is provided with a printing pattern 3' and placed over the material 4 to be printed upon, this material having the form of a plate or board for printed circuitry, wherewith during said movement the squeegee presses a print-forming agent 10 through the pattern 3' on the stencil 3 and onto the material 4. Although not shown in FIG. 1, it will be understood that the printing material 4 is supported by a printing platen.

Figure 2:
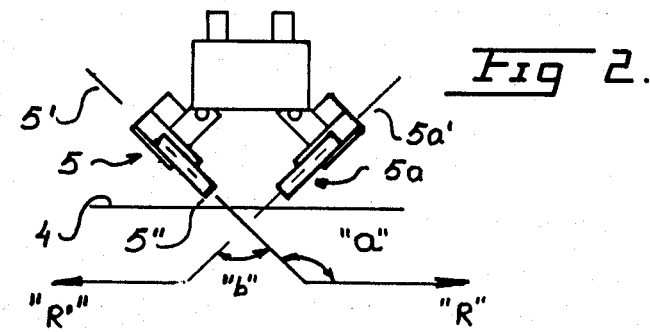
FIG. 2 is a side view of the squeegee arrangement with two inclined squeegees illustrated in FIG. 1.

A plane 5' extending centrally through the squeegee is arranged to form an obtuse angle "a" with the stencil 3 and the material, in relation to squeegee movement indicated by an arrow "R" in FIG. 2.

A second squeegee 5a is arranged adjacent the squeegee 5 and has a centrally located plane 5a' which is arranged to form an angle "b" with the plane 5'.

These angles can be altered with the aid of means not shown. The angles can also be changed during a printing operation, so as to control or regulate the amount of print-forming substance passing through the stencil pattern.

The angle "b" is smaller than 120° and greater than 60°, preferably between 100° and 80°.

The angle "a" is chosen in dependence on the shape of the tip of the squeegee and on the amount of print-forming agent to be pressed through the stencil via a given position, and also in dependence on the viscosity of the agent and the structure of the printing material. The angle, however, is preferably smaller than 150°.

In addition, it is proposed that the planes 5' and 5a' are oriented at mutually the same angle, or substantially the same angle, to the vertical.

The squeegee 5 co-acts with the stencil to produce print on the upper surface 4a of the printing material 4 in a first direction of movement "R", whereas the squeegee 5a co-acts with the stencil 3 to produce print in an opposite direction of movemeht "R".

While the squeegee 5 co-operates with the stencil 3 for printing in the first direction "R", as in FIG. 2, the other squeegee 5a may be raised slightly and used as a means for distributing the print-forming substance, or ink paste 10, onto the upper surface of the stencil. In the other print direction it is the squeegee 5a which is lifted for this purpose, this lifting and lowering of the squeegees being achieved with the aid of means not shown.

The supporting part 5" of the squeegee facing the stencil 3 has the form of a pointed or relatively sharp edge formed by two surfaces placed at right angles to one another.

The squeegee arrangement according to this invention is primarily intended for use when applying print to printed circuit boards or cards, in which the upper board-surface 4a is irregular and normally presents raised parts 12,13 intended for weld connections, such that somewhat depressed parts 14 are found slightly beneath the upper surface of the raised parts, wherewith the said squeegee arrangement is intended to pass the print-forming substance 10 effectively down into the depressed areas on the board or card, such as the depressed area 14.

Since the present invention enables an adapted thin print to be applied to a substrate through a stencil, and since the squeegee shall be displaced along the stencil under pressure while generating friction, with correspondingly marked stretching of the stencil, the printed pattern in a first direction of squeegee movement will be extended in this direction, and in the opposite, second direction of squeegee movement will be extended in this second direction.

This two-fold discrepancy needs to be compensated for.

The U.S. Pat. No. 4,193,344 discloses a method of compensating for stretching of the stencil in one direction.

Figure 3:
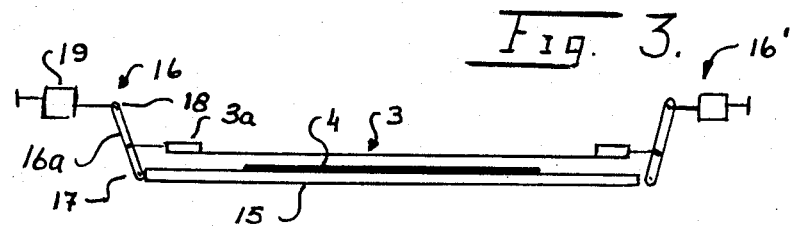
FIG. 3 is a side view of a printing platen and a stencil stretched in a stencil frame, and illustrates schematically a discrepancy compensating device; the squeegee arrangement is not shown in this Figure, however.

FIG. 3 illustrates a stationary printing platen 15 on which a registered or aligned material substrate 4 rests in means not shown, this substrate being intended to receive print corresponding to the pattern 3' of the stencil 3.

Since the stencil 3 is stretched to the right in FIG. 3 as the squeegee moves during a printing sequence, there is provided in the illustrated embodiment two, oppositely situated discrepancy compensating devices 16 and 16' which are arranged to displace the frame 3a carrying the stencil respectively to the left and to the right in FIG. 1, in response to a device (not shown) which establishes the position of the squeegee.

Each device 16, 16' comprises a lever 16a one end 17 of which is in firm connection with the printing platen 15, and the other end 18 of which co-acts with a setting motor capable of displacing the free end 18 forwards and backwards in a horizontal plane. The stencil frame 3a is attached to the central part of respective levers.

Means, not shown, are provided which enable the motor 19 to be controlled precisely in dependence on the position of the squeegee along the stencil and on the prevailing frictional forces and stencil material, so as to make accurate compensation at each point along the printing path.

The device 16' is disengaged so that the aforesaid adjustments can be made.

In the direction of movement of the squeegee 5a, the stencil is stretched to the left in FIG. 3, the discrepancy compensating device functioning in a manner similar to the device 16, which is, of course, disengaged at this stage of the printing process.

It has been found that so-called skipping and bleeding can be effectively mastered by means of the present invention, via the printing or application of solder-stop varnish.

By skipping is meant that on printed circuit boards or cards, the surfaces between the conductors formed thereon are incompletely filled with ink. Bleeding means that the ink creeps beneath the stencil and creates an uneven edge and a decrease in the size of the negative print-image at the soldering lug.

The two squeegees 5,5a, may also be so arranged and caused to co-act with means, not shown, in a manner such that the squeegees can be brought, as a unit, to a position in which they are inclined to the plane of squeegee movement, therewith to enable narrow, transversally extending conductors and/or interspaces, for example conductors having a width of 0.25 mm and interspaces having a width of 0.4 mm, to be coated with solder-stop varnish or ink.

The problem of skipping and bleeding has been found difficult to overcome effectively when using readily flowing ink or varnish. Dilution or thinning should particularly be effected to above 5%, preferably about 10%.

The problem of skipping can also be expected to increase at increasing squeegee speeds.

In order to provide a general solution to both the problem of skipping and of bleeding, it is proposed in accordance with the invention that the squeegees are not moved faster than 30 cm/second, although faster than 15 cm/second, and that the ink is thinned by at least 5% and at most 15%, preferably about 10%.

Since pressing of the print-forming substance through the stencil pattern is dependent on the angle of the squeegee to the stencil, it is proposed, if found necessary, to vary the squeegee angle during a printing sequence, by rotating the squeegee on the axle 7.

It will be understood that the invention is not limited to the described and illustrated exemplifying embodiment, and that modifications can be made to said embodiment within the scope of the following claims.

I claim:

1. A squeegee arrangement for silkscreen printing machines, comprising two squeegees arranged side-by-side and made from a somewhat flexible material, and respective squeegee holders, in which arrangment the squeegees are arranged to move relative to a stencil having a printing pattern provided thereon and located above a material substrate to be printed upon and supported on a stencil frame, said sqeegees being arranged to press print-forming substance through the stencil and onto the material substrate during said relative movement, and in which arrangment a plane extending centrally through respective squeegees forms an obtuse angle with the stencil and the material substrate in relation to the directional plane of squeegee movement, wherein the centrally located planes of respective squeegees subtend therebetween an angle of less than 120° and greater than 60°; and one of said squeegees is arranged to co-act with the stencil to effect printing in a first direction of squeegee movement, the other squeegee is arranged to co-act with the stencil to effect printing in a second direction opposite to said first direction; adjustment means for adjusting the angular range during a printing sequence; and means for displacing the stencil in a direction opposite to the direction of squeeges movement and compensate for discrepancies occurring in the print-pattern of the stencil on the substrate material as a result of stencil strength, said means for displacing the stencil connected to the stencil frame and displacing the frame in response to movement of said squeegees.

2. A squeegee arrangement according to claim 1, wherein the arrangement is such that when the one squeegee co-acts with the stencil for printing in a first direction of relative movement, the other squeegee serves as a means for distributing the print-forming substance over the upper surface of the stencil, and vice versa.

3. A squeegee arrangement according to claim 1 wherein the squeegee portion facing and engaging the stencil has the form of an edge formed by two mutually perpendicular surfaces.

4. A squeegee arrangement according to claim 1, wherein said angle is from 100° to 80°.

5. A squeegee arrangement according to claim 1, wherein said means is arranged to displace the stencil in two mutually opposite directions.

6. A squeegee arrangement according to claim 1 wherein the printing platen and the material substrate are displaceable in the direction of squeegee movement during a printing sequence.

7. A squeegee arrangement according to claim 1, wherein the squeegees are inclined to the directional plane of squeegee movement.

8. A squeegee arrangement according to claim 2, wherein the squeege portion facing and engaging the stencil has the form of an edge formed by two mutually perpendicular surfaces.

* * * * *